US009997250B2

(12) United States Patent
Park et al.

(10) Patent No.: US 9,997,250 B2
(45) Date of Patent: Jun. 12, 2018

(54) NON-VOLATILE MEMORY DEVICE WITH A PLURALITY OF CACHE LATCHES AND SWITCHES AND METHOD FOR OPERATING NON-VOLATILE MEMORY DEVICE

(71) Applicant: SK hynix Inc., Gyeongg-do (KR)

(72) Inventors: Kang-Woo Park, Gyeonggi-do (KR); Eun-Ji Choi, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days. days.

(21) Appl. No.: 15/288,918

(22) Filed: Oct. 7, 2016

(65) Prior Publication Data

US 2017/0271019 A1    Sep. 21, 2017

(30) Foreign Application Priority Data

Mar. 17, 2016  (KR) .......................... 10-2016-0032015
Apr. 21, 2016  (KR) .......................... 10-2016-0048765

(51) Int. Cl.
| | | |
|---|---|---|
| *G11C 16/24* | (2006.01) | |
| *G11C 16/04* | (2006.01) | |
| *G11C 16/26* | (2006.01) | |
| *G11C 16/30* | (2006.01) | |
| *G11C 16/10* | (2006.01) | |

(Continued)

(52) U.S. Cl.
CPC ................ *G11C 16/24* (2013.01); *G11C 7/06* (2013.01); *G11C 7/106* (2013.01); *G11C 7/1048* (2013.01); *G11C 7/12* (2013.01); *G11C 16/0483* (2013.01); *G11C 16/10* (2013.01); *G11C 16/26* (2013.01); *G11C 16/30* (2013.01)

(58) Field of Classification Search
CPC ......... G11C 16/24; G11C 7/06; G11C 7/1048; G11C 7/106; G11C 7/12; G11C 16/0483; G11C 16/10; G11C 16/26; G11C 16/30
USPC ............. 365/185.12, 185.21, 185.11, 185.17
See application file for complete search history.

(56) References Cited

U.S. PATENT DOCUMENTS 5,541,879  A  *  7/1996  Suh .................. G11C 16/12
                                            365/185.05
5,748,529  A  *  5/1998  Lee .................. G11C 16/24
                                            365/185.17

(Continued)

FOREIGN PATENT DOCUMENTS

KR   1020040070174   8/2004
KR   1020050002483   1/2005

(Continued)

*Primary Examiner* — Vu Le
*Assistant Examiner* — Sung Cho
(74) *Attorney, Agent, or Firm* — IP & T Group LLP

(57) ABSTRACT

A non-volatile memory device includes: a plurality of cache latches; a pair of input/output lines; a plurality of switches, each couples a corresponding cache latch to the pair of the input/output lines, when the corresponding cache latch is selected among the plurality of cache latches; a pre-charger suitable for pre-charging the pair of the input/output lines; and a sense-amplifier suitable for sensing and amplifying the data of the pair of the input/output lines, wherein the sense-amplifier operates with a first power source voltage, and the plurality of the cache latches, the plurality of the switches, and the pre-charger operate with a second power source voltage having a voltage level that is higher than the voltage level of the first power source voltage.

18 Claims, 8 Drawing Sheets

(51) Int. Cl.
*G11C 7/06* (2006.01)
*G11C 7/10* (2006.01)
*G11C 7/12* (2006.01)

(56) References Cited

U.S. PATENT DOCUMENTS

| | | | | |
|---|---|---|---|---|
| 5,768,215 A * | 6/1998 | Kwon | ................. | G11C 7/1021 |
| | | | | 365/185.12 |
| 5,963,475 A * | 10/1999 | Choi | ................. | G11C 8/12 |
| | | | | 365/185.11 |
| 6,049,494 A * | 4/2000 | Sakui | ................. | G11C 16/0483 |
| | | | | 365/185.25 |
| 2001/0050377 A1* | 12/2001 | Ikehashi | ............ | G11C 16/3468 |
| | | | | 257/200 |
| 2002/0011883 A1* | 1/2002 | Yamazaki | ................. | G11C 5/14 |
| | | | | 327/143 |
| 2003/0016562 A1* | 1/2003 | Im | ................. | G11C 7/1039 |
| | | | | 365/189.02 |
| 2003/0076719 A1* | 4/2003 | Byeon | ................. | G06F 12/0893 |
| | | | | 365/200 |
| 2004/0141374 A1* | 7/2004 | Park | ................. | G11C 16/10 |
| | | | | 365/185.08 |
| 2004/0240268 A1* | 12/2004 | Kim | ................. | G11C 29/846 |
| | | | | 365/185.09 |
| 2007/0002625 A1* | 1/2007 | Park | ................. | G11C 16/08 |
| | | | | 365/185.12 |
| 2007/0268748 A1* | 11/2007 | Lee | ................. | G11C 11/5628 |
| | | | | 365/185.08 |
| 2007/0297228 A1* | 12/2007 | Song | ................. | G11C 11/5628 |
| | | | | 365/185.08 |
| 2010/0074011 A1* | 3/2010 | Kang | ................. | G11C 11/5628 |
| | | | | 365/185.03 |
| 2011/0158002 A1* | 6/2011 | Ha | ................. | G11C 16/06 |
| | | | | 365/185.25 |
| 2011/0299343 A1* | 12/2011 | Lee | ................. | G11C 16/24 |
| | | | | 365/185.25 |
| 2012/0099390 A1* | 4/2012 | Cho | ................. | G11C 7/1048 |
| | | | | 365/203 |
| 2013/0163362 A1* | 6/2013 | Kim | ................. | G11C 7/00 |
| | | | | 365/203 |
| 2014/0355356 A1* | 12/2014 | Lim | ................. | G11C 7/1048 |
| | | | | 365/185.23 |
| 2016/0180947 A1* | 6/2016 | Lim | ................. | G11C 29/702 |
| | | | | 365/185.12 |

FOREIGN PATENT DOCUMENTS

KR 1020070101073 10/2007
KR 1020100048420 5/2010

* cited by examiner

NON-VOLATILE MEMORY DEVICE WITH A PLURALITY OF CACHE LATCHES AND SWITCHES AND METHOD FOR OPERATING NON-VOLATILE MEMORY DEVICE

CROSS-REFERENCE TO RELATED APPLICATIONS

The present application claims priority under 35 U.S.C § 119(a) to Korean Patent Application No. 10-2016-0048765, filed on Apr. 21, 2016, in the Korean Intellectual Property Office, the disclosure of which is incorporated herein by reference in its entirety.

The present application claims priority under 35 U.S.C § 119(a) to Korean Patent Application No. 10-2016-0032015, filed on Mar. 17, 2016, in the Korean Intellectual Property Office, the disclosure of which is incorporated herein by reference in its entirety.

BACKGROUND

1. Field

Exemplary embodiments of the present invention relate generally to a non-volatile memory device and a method for operating the non-volatile memory device.

2. Description of the Related Art

Non-volatile memory devices retain data stored therein even when power supply is cut off. Non-volatile memory devices store data by taking advantage of a threshold voltage change of memory cells by controlling the amount of charges held in a conductive band of a floating gate.

When a program pulse is applied to a floating gate, the threshold voltage of a memory cell rises. The threshold voltage of a memory cell may be made different according to the value of a data to be stored in the memory cell by using the program pulse. However, since the characteristics of a plurality of memory cells in a non-volatile memory device are different, the threshold voltages of the memory cells storing the same data are not the same but they form a distribution.

Meanwhile, a plurality of memory cells in a non-volatile memory device are coupled to bit lines. Each of the bit lines is coupled to a page buffer. A page buffer may drive its corresponding bit line with a predetermined voltage level to perform a predetermined operation, such as a read operation or a write operation, on the selected memory cells that are coupled to the corresponding bit line, or sense the voltage of the bit line and store and output the sensed value. A page buffer typically includes one or more latches to store a data inputted from an external device and drive the corresponding bit line with a predetermined voltage, or to sense the voltage of the corresponding bit line, store the data corresponding to the voltage of the bit line, and transfer the data to an external device.

Among the one or more latches included in each page buffer, a cache latch stores the data of selected memory cells during a data read operation, and drives a line for transferring the data to the external device based on a stored value. Hereafter, the transferring of the data stored in the cache latch of a page buffer to an external device is described with reference to FIG. 1.

FIG. 1 shows a part of a non-volatile memory device for describing how data of a cache latch are transferred.

Referring to FIG. 1, the non-volatile memory device may include a cache latch 110, a switch 120, a pair of an input/output line IO and an input/output bar line IOB, and a pre-charger 130.

The cache latch 110 may include a data node Q and a data bar node QB. During a read operation, the data of a bit line (not shown in FIG. 1) may be sensed and stored in the cache latch 110. When a column selection signal CS<0> is enabled, the switch 120 is turned on to couple the cache latch 110 and the pair of the input/output line IO and the input/output bar line IOB to each other.

The pre-charger 130 may pre-charge the pair of the input/output line IO and the input/output bar line IOB with a power source voltage VCC before the pair of the input/output line IO and the input/output bar line IOB is coupled to the cache latch 110. When the data node Q and the data bar node QB of the cache latch 110 are coupled to the input/output line IO and the input/output bar line IOB of the pair, a discharge path may be formed by one inverter among the inverters IV1 and IV2 of the cache latch 110 to drop the voltage level of one input/output line between the input/output line IO and the input/output bar line IOB of a pair. When the voltage difference between the input/output line IO and the input/output bar line IOB of the pair is greater than a predetermined level, the data may be detected and outputted.

However, as the integration degree of non-volatile memory devices increases with ever-decreasing power source voltage, the above-described discharge rate becomes slow and eventually, it takes longer time for the voltage difference between an input/output line IO and an input/output bar line IOB of a pair to reach a predetermined level. This becomes an obstacle to the high-speed operation of the non-volatile memory devices.

SUMMARY

Embodiments of the present invention are directed to a non-volatile memory device having a high read operation rate by increasing the operation voltage of a structure for sensing data and the pre-charge level of input/output lines.

In accordance with an embodiment of the present invention, a non-volatile memory device includes: a plurality of cache latches; a pair of input/output lines; a plurality of switches, each couples a corresponding cache latch to the pair of the input/output lines, when the corresponding cache latch is selected among the plurality of cache latches; a pre-charger suitable for pre-charging the pair of the input/output lines; and a sense-amplifier suitable for sensing and amplifying the data of the pair of the input/output lines, wherein the sense-amplifier operates with a first power source voltage, and the plurality of the cache latches, the plurality of the switches, and the pre-charger operate with a second power source voltage having a voltage level that is higher than the voltage level of the first power source voltage.

Each of the plurality of the cache latches may include: a data node; a data bar node; a first inverter that operates with the second power source voltage and drives the data bar node in response to a voltage of the data node; and a second inverter that operates with the second power source voltage and drives the data node in response to a voltage of the data bar node.

The pair of the input/output lines may include an input/output line and an input/output bar line, and each of the plurality of the switches may include: a first switch transistor that is coupled between a data node and the input/output bar line and turned on/off in response to a corresponding column selection signal among a plurality of column selection signals whose enabling level is a voltage level of the second power source voltage; and a second switch transistor that is coupled between a data bar node and the input/output line and turned on/off in response to the corresponding column selection signal among the plurality of the column selection signals.

The pair of the input/output lines may include an input/output line and an input/output bar line, and the pre-charger may include: a first pre-charge transistor that has a first end coupled to the input/output line and a second end supplied with the second power source voltage, and is turned on during a pre-charge time period; and a second pre-charge transistor that has a first end coupled to the input/output bar line and a second end supplied with the second power source voltage, and is turned on during the pre-charge time period.

The pre-charger may pre-charge the pair of the input/output lines with the second power source voltage during a pre-charge time period.

The first inverter may include: a first PMOS transistor that has a first end coupled to the data bar node and a second end supplied with the second power source voltage, and is turned on/off in response to a voltage of the data node; and a first NMOS transistor that has a first end coupled to the data bar node and a second end supplied with a ground voltage, and is turned on/off in response to the voltage of the data node, and the second inverter may include: a second PMOS transistor that has a first end coupled to the data node and a second end supplied with the second power source voltage, and is turned on/off in response to a voltage of the data bar node; and a second NMOS transistor that has a first end coupled to the data node and a second end supplied with the ground voltage, and is turned on/off in response to the voltage of the data bar node.

In accordance with another embodiment of the present invention, a non-volatile memory device may include: a plurality of cell strings each of which includes one or more non-volatile memory cells serially coupled to each other; a plurality of bit lines that are coupled to corresponding cell strings, respectively, among the plurality of the cell strings; a plurality of page buffers each of which includes a cache latch, senses a data of a corresponding bit line among the plurality of the bit lines during a read operation, and stores the sensed data in the cache latch; a pair of input/output lines; a plurality of switches each of which couples a corresponding cache latch to the pair of the input/output lines when the corresponding cache latch is selected among a plurality of cache latches; a pre-charger that pre-charges the pair of the input/output lines; and a sense-amplifier that amplifies data of the pair of the input/output lines and outputs amplified data, wherein the plurality of the page buffers and the sense-amplifier operate with a first power source voltage, and the cache latches, the plurality of the switches, and the pre-charger operate with a second power source voltage whose voltage level is higher than a voltage level of the first power source voltage.

Each of the plurality of the cache latches may include: Each of the plurality of the cache latches may include: a data node; a data bar node; a first inverter that operates with the second power source voltage and drives the data bar node in response to a voltage of the data node; and a second inverter that operates with the second power source voltage and drives the data node in response to a voltage of the data bar node.

The pair of the input/output lines may include an input/output line and an input/output bar line, and each of the plurality of the switches may include: a first switch transistor that is coupled between a data node and the input/output bar line and turned on/off in response to a corresponding column selection signal among a plurality of column selection signals whose enabling level is a voltage level of the second power source voltage; and a second switch transistor that is coupled between a data bar node and the input/output line and turned on/off in response to the corresponding column selection signal among the plurality of the column selection signals.

The pair of the input/output lines may include an input/output line and an input/output bar line, and the pre-charger may include: a first pre-charge transistor that has a first end coupled to the input/output line and a second end supplied with the second power source voltage, and is turned on during a pre-charge time period; and a second pre-charge transistor that has a first end coupled to the input/output bar line and a second end supplied with the second power source voltage, and is turned on during the pre-charge time period.

The pre-charger may pre-charge the pair of the input/output lines with the second power source voltage during a pre-charge time period.

The first inverter may include: a first PMOS transistor that has a first end coupled to the data bar node and a second end supplied with the second power source voltage, and is turned on/off in response to a voltage of the data node; and a first NMOS transistor that has a first end coupled to the data bar node and a second end supplied with a ground voltage, and is turned on/off in response to the voltage of the data node, and the second inverter may include: a second PMOS transistor that has a first end coupled to the data node and a second end supplied with the second power source voltage, and is turned on/off in response to a voltage of the data bar node; and a second NMOS transistor that has a first end coupled to the data node and a second end supplied with the ground voltage, and is turned on/off in response to the voltage of the data bar node.

When the data stored in the cache latch during a read operation is a first data, a first discharge path may be formed from the input/output bar line to the second end of the second NMOS transistor, and when the data stored in the cache latch during the read operation is a second data, a second discharge path may be formed from the input/output line to the second end of the first NMOS transistor.

In accordance with another embodiment of the present invention, a method for operating a non-volatile memory device that that may include a plurality of cache latches and a plurality of switches coupling corresponding cache latches among the plurality of the cache latches to a pair of input/output lines, and operates with a first power source voltage, may include: pre-charging the pair of the input/output lines with a second power source voltage whose voltage level is higher than the first power source voltage; turning on a switch among the plurality of the switches that corresponds to a selected cache latch among the plurality of the cache latches by supplying the second power source voltage to the switch; and letting current flow from the pair of the input/output lines to the selected cache latch.

The method may further include: amplifying data of the pair of the input/output lines by using the first power source voltage and outputting amplified data.

The non-volatile memory device may further include: a plurality of bit lines corresponding to the plurality of the cache latches, respectively, and the method may further include: storing data of the plurality of the bit lines in the plurality of the cache latches.

Each of the plurality of the cache latches may include a data node; a data bar node; a first inverter that operates with the second power source voltage and drives the data bar node in response to a voltage of the data node; and a second inverter that operates with the second power source voltage and drives the data node in response to a voltage of the data bar node.

In the letting the current flow from the pair of the input/output lines to the selected cache latch, when the data stored in the cache latch is a first data, a first discharge path may be formed from the pair of the input/output lines to the second inverter, and when the data stored in the cache latch is a second data, a second discharge path may be formed from the pair of the input/output lines to the first inverter.

DETAILED DESCRIPTION

Figure 1:
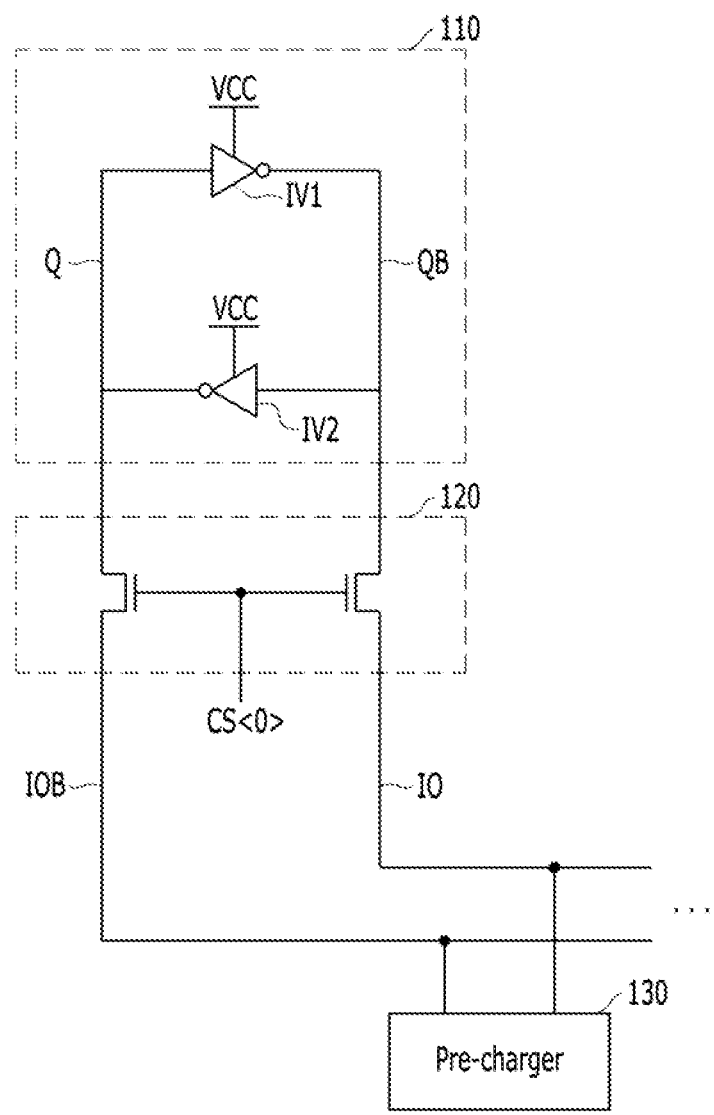
FIG. 1 shows a part of a non-volatile memory device for describing how data of a cache latch is transferred.

Exemplary embodiments of the present invention will be described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the present invention to those skilled in the art. Throughout the disclosure, like reference numerals refer to like parts throughout the various figures and embodiments of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to more clearly illustrate the various elements of the embodiments. For example, in the drawings, the size of elements and the intervals between elements may be exaggerated compared to actual sizes and intervals for convenience of illustration.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises", "comprising", "includes", and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth for providing a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element (also referred to as a feature) described in connection with one embodiment may be used singly or in combination with other elements of another embodiment, unless specifically indicated otherwise.

Hereinafter, the various embodiments of the present invention will be described in detail with reference to the attached drawings.

Figure 2:
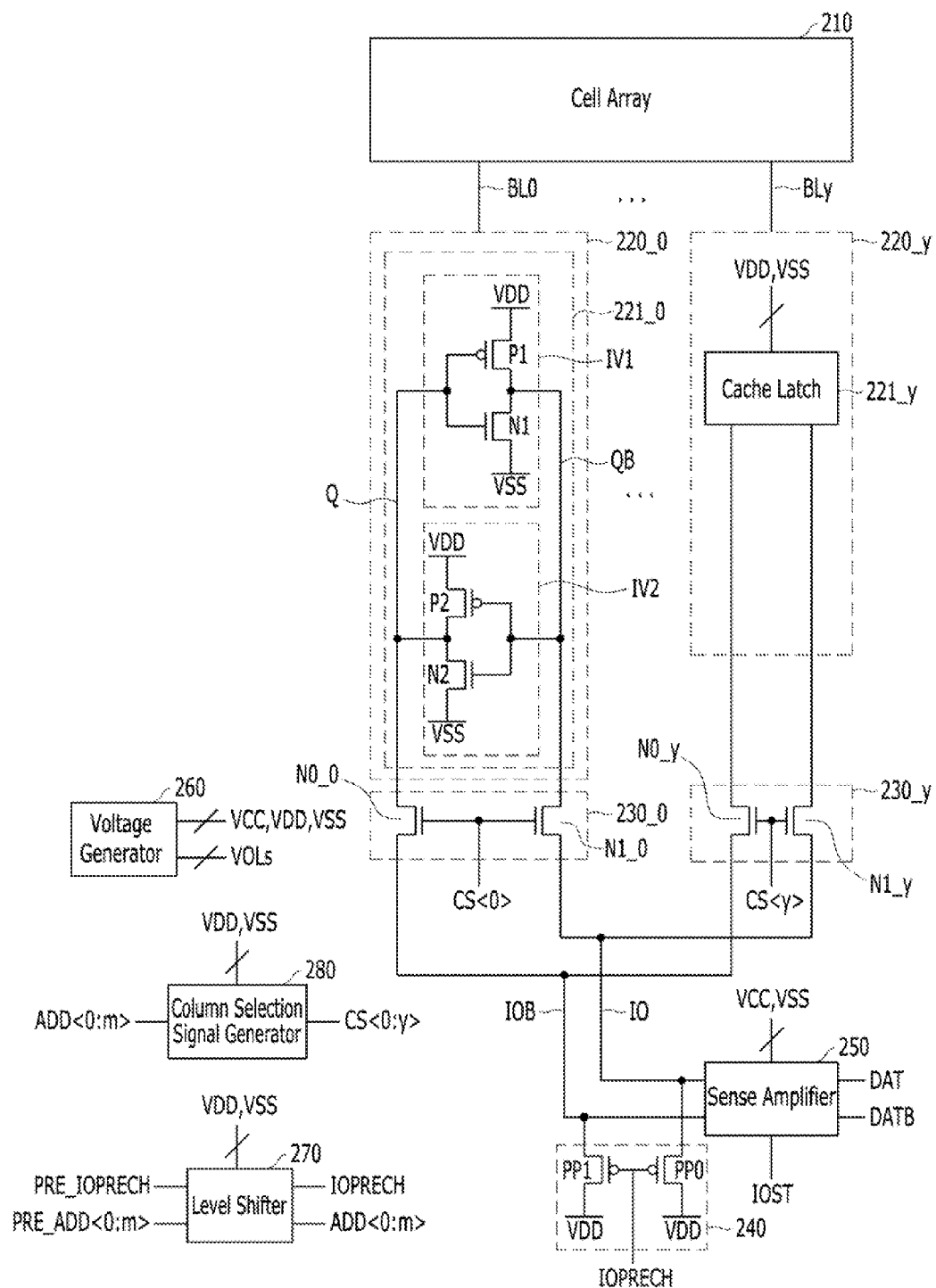
FIG. 2 is a block diagram illustrating a non-volatile memory device, in accordance with an embodiment of the present invention.

FIG. 2 is a block diagram illustrating a non-volatile memory device, in accordance with an embodiment of the present invention.

Referring to FIG. 2, the non-volatile memory device may include a cell array 210, a plurality of bit lines BL0 to BLy, where y is a natural number, a plurality of switches 230_0 to 230_y, a pre-charger 240, a sense amplifier 250, a voltage generator 260, a level shifter 270, a column selection signal generator 280, and a pair of input/output lines IO and an input/output bar line IOB. The non-volatile memory device shown in FIG. 2 may use two or more power source voltages VCC and VDD. A first power source voltage VCC may be a main power source voltage of the non-volatile memory device. A second power source voltage VDD may provide a higher voltage level than the first power source voltage VCC. The pair of the input/output lines 10 and the input/output bar line IOB may include an input/output line IO and an input/output bar line IOB.

Figure 3:
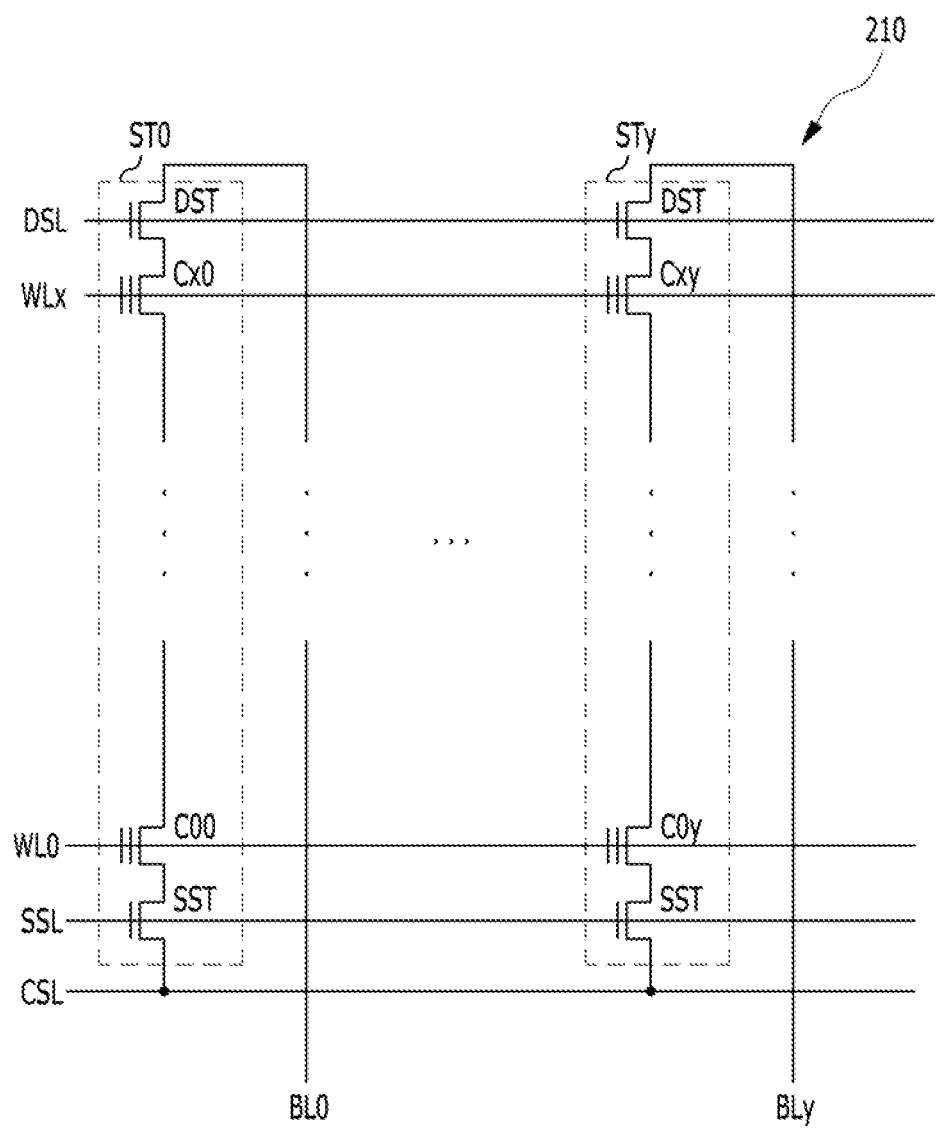
FIG. 3 is a circuit diagram illustrating a cell array 210 shown in FIG. 2.

FIG. 3 is a circuit diagram illustrating the cell array 210 shown in FIG. 2.

Referring to FIG. 3, the cell array 210 may include a plurality of cell strings ST0 to STy, each cell string being coupled between a respective bit line among the plurality of bit lines BL0 to Bly and a common source line CSL. The cell strings ST0 to STy may be coupled to the corresponding bit lines BL0 to BLy, respectively, and they may be coupled to the common source line CSL in common. Each of the cell strings ST0 to STy may include a source selection transistor SST whose source is coupled to the common source line CSL, a plurality of memory cells C00 to Cxy, and a drain selection transistor DST whose drain is coupled to the bit lines BL0 to BLy. The memory cells C00 to Cxy may be serially coupled between the source selection transistor SST and the drain selection transistor DST. The gate of the source selection transistor SST may be coupled to a source selection line SSL, and the gates of the memory cells C00 to Cxy, where x and y are a natural number, may be coupled to word lines WL0 to WLx, and the gate of the drain selection transistor DST may be coupled to a drain selection line DSL.

During a read operation, the bit lines BL0 to BLy may be pre-charged, and a voltage for turning on the drain selection transistor DST and the source selection transistor SST may be applied to the drain selection line DSL and the source selection line SSL, and a ground voltage may be applied to the common source line CSL. A voltage for reading the data of memory cells may be applied to a selected word line, and a pass voltage may be applied to the other word lines that are not selected. The pass voltage may be of a voltage level sufficiently high to turn on all the memory cells. The voltage applied to the drain selection transistor DST and the source selection transistor SST may be the first power source voltage VCC. The voltages of the bit lines BL0 to BLy may be different according to the data stored in the corresponding memory cells.

Referring to FIGS. 2 and 3, a plurality of page buffers 220_0 to 220_y may be coupled in one to one correspondence to respective bit lines BL0 to BLy. For example, page buffer 220_0 may be coupled to bit line BL0, page buffer 220_1 may be coupled to bit line BL1, and so on and so forth with page buffer 220_y being coupled to bit line BLy. The page buffers 220_0 to 220_y may include cache latches 221_0 to 221_y, respectively. The page buffers 220_0 to 220_y may store the data sensed from the corresponding bit lines BL0 to BLy during a read operation in the cache latches 221_0 to 221_y.

Each of the cache latches 221_0 to 221_y may include a data node Q, a data bar node QB, a first inverter IV1, and a second inverter IV2. The first inverter IV1 may operate with the second power source voltage VDD, and drive the data bar node QB in response to the voltage of the data node Q. The second inverter IV2 may operate with the second power source voltage VDD, and drive the data node Q in response to the voltage of the data bar node QB.

The first inverter IV1 may include a first PMOS transistor P1 and a first NMOS transistor N1. A first end of the first PMOS transistor P1 may be coupled to the data bar node QB, a second end of the PMOS transistor P1 may be supplied with the second power source voltage VDD. The PMOS transistor P1 may be turned on/off in response to the voltage of the data node Q. The first NMOS transistor N1 may have a first end coupled to the data bar node QB and a second end supplied with the ground voltage VSS. The first NMOS transistor N1 may be turned on/off in response to the voltage of the data node Q.

The second inverter IV2 may include a second PMOS transistor P2 having a first end coupled to the data node Q, a second end supplied with the second power source voltage VDD and may be turned on/off in response to the voltage of the data bar node QB. The second Inverter IV2 may also Include a second NMOS transistor N2 having a first end coupled to the data node Q and a second end supplied with the ground voltage VSS. The second NMOS transistor N2 may be turned on/off in response to the voltage of the data bar node QB.

FIG. 2 briefly shows the internal structure of the cache latch 221_0 for the sake of convenience in description, and the internal structures of the other cache latches 221_1 to 221_y are omitted. However, the other cache latches 221_1 to 221_y may have the same internal structure as that of the cache latch 221_0.

When corresponding cache latches among the cache latches 221_0 to 221_y are selected, the switches 230_0 to 230_y may couple the cache latches with a corresponding pair of an input/output line IO and an input/output bar line IOB. Each of a plurality of column selection signals CS<0:y> corresponds to one cache latch among the cache latches 221_0 to 221_y. When a cache latch is selected, the selected cache latch may be activated with the voltage level of the second power source voltage VDD.

Each of the switches 230_0 to 230_y may include a pair of a first switch transistor and a second switch transistor, the first switch transistor being one of a plurality of first switch transistors NO_0 to NO_y and the second switch transistor being one of a plurality of second switch transistors N1_0 to N1_y, respectively. hence, a first pair of switch transistors NO_0 and N1_0 is included in the first switch 230_0, a second pair of switch transistors NO_1 and N1_1 is included in the second switch 230_1, and so on and so forth with an $y^{th}$ pair of switch transistors included in the $y^{th}$ switch 230_y. Each of the first switch transistors NO_0 to NO_y is coupled between the data node Q and the input/output bar line IOB of the corresponding cache latch and is turned on/off in response to a corresponding column selection signal among the column selection signals CS<0:y> whose enabling level is the voltage level of the second power source voltage VDD. Each of the second switch transistors N1_0 to N1_y is coupled between the data bar node QB and the input/output line IO of the corresponding cache latch and is turned on/off in response to a corresponding column selection signal among the column selection signals CS<0:y>.

FIG. 2 schematically shows the internal structure of the switch 230_0 for the sake of convenience in description, while the internal structures of the other switches 230_1 to 230_y are omitted. However, the other switches 230_1 to 230_y may have the same internal structure as that of the switch 230_0.

The pre-charger 240 may pre-charge a pair of an input/output line IO and an input/output bar line IOB with the second power source voltage VDD in during a pre-charge time period. The pre-charger 240 may include a first pre-charge PMOS transistor PP0 and a second pre-charge PMOS transistor PP1. The first pre-charge transistor PP0 has a first end coupled to the input/output line IO, a second end supplied with the second power source voltage VDD, and is turned on in during the pre-charge time period. The second pre-charge transistor PP1 has a first end coupled to the input/output bar line IOB, a second end supplied with the second power source voltage VDD, and is turned on in during the pre-charge time period. The first and the second pre-charge transistors PP0 and PP1 may be turned on/off in response to a pre-charge signal IOPRECH that is enabled to a low logic level VSS in during the pre-charge time period.

The sense amplifier 250 may amplify the data of the pair of the input/output line IO and the input/output bar line IOB. The sense amplifier 250 operates with the first power source voltage VCC, and when the voltage level difference between the input/output line IO and the input/output bar line IOB of the pair becomes greater than a predetermined value, the sense amplifier 250 may sense the data of the pair of the input/output line IO and the Input/output bar line IOB and output data DAT and DATB. The sense amplifier 250 may be activated in response to an enable signal IOST. Herein, when the voltage level of the input/output line IO is higher than the voltage level of the input/output bar line IOB, the output data DAT becomes to be of a high logic level, while the output data DATB becomes to be of a low logic level (which is a high data output). When the voltage level of the input/output bar line IOB is higher than the voltage level of the input/output line IO, the output data DAT becomes to be of a low logic level, while the output data DATB becomes to be of a high logic level (which is a low data output).

The voltage generator 260 may generate the power source voltages VCC, VDD, VSS and VOLs that are used in the inside of the non-volatile memory device. The power source voltage VOLs may be a voltage level used in the non-volatile memory device, other than the first power source voltage VCC, the second power source voltage VDD, and the ground voltage VSS.

The level shifter 270 may shift the disabling level of a preliminary pre-charge signal PRE_IOPRECH which has the voltage level of the first power source voltage VCC in a disabled state to the voltage level of the second power source voltage VDD so as to generate the pre-charge signal IOPRECH. Also, the level shifter 270 may shift the high level of a plurality of preliminary address signals PRE_ADD<0:m> (where m is a natural number), which have the voltage level of the ground voltage VSS in a low logic level and have the voltage level of the first power source voltage VCC in a high logic level, into the voltage level of the second power source voltage VDD so as to generate a plurality of address signals ADD<0:m>, where m is a natural number.

The column selection signal generator 280 may generate a plurality of column selection signals CS<0:y> by decoding the address signals ADD<0:m>.

In an embodiment, the sense amplifier 250 may operate with the first power source voltage VCC, the cache latches 221_0 to 221_y, the switches 230_0 to 230_y, and the pre-charger 240 may operate with the second power source voltage VDD.

In an embodiment, the cache latches 221_0 to 221_y, the switches 230_0 to 230_y, and the sense amplifier 250 may operate with the first power source voltage VCC, and the pre-charger 240 may operate with the second power source voltage VDD.

In an embodiment, the cache latches 221_0 to 221_y and the sense amplifier 250 may operate with the first power source voltage VCC, the switches 230_0 to 230_y and the pre-charger 240 may operate with the second power source voltage VDD.

In an embodiment, the switches 230_0 to 230_y and the sense amplifier 250 may operate with the first power source voltage VCC, the cache latches 221_0 to 221_y and the pre-charger 240 may operate with the second power source voltage VDD.

Figure 4:
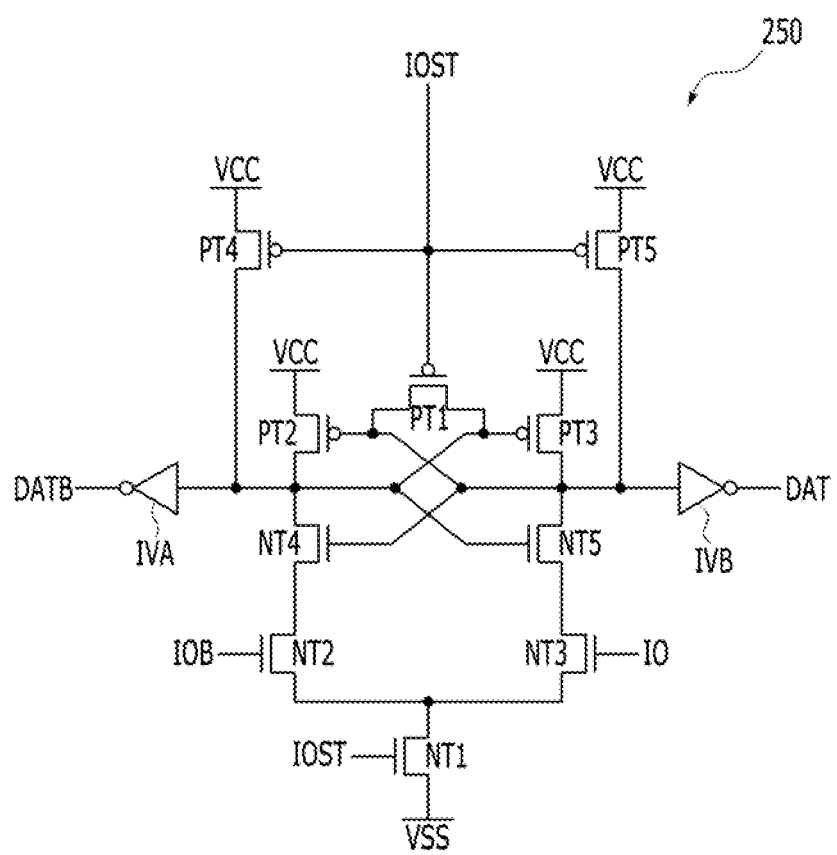
FIG. 4 is a circuit diagram illustrating a sense amplifier 250 shown in FIG. 2.

FIG. 4 is a circuit diagram illustrating the sense amplifier 250 shown in FIG. 2.

Referring to FIG. 4, the sense amplifier 250 may include a plurality of NMOS transistors NT1 to NT5, a plurality of PMOS transistors PT1 to PT5, and a plurality of inverters IVA and IVB.

The ground voltage VSS may be applied to one end of the transistor NT1, and when the enable signal IOST is in a high logic level, the transistor PT1 may be turned on. The first power source voltage VCC may be applied to one end of each of the transistors PT1 to PT3, and when the enable signal IOST is in a low logic level, the transistors PT1 to PT3 may be turned on. The transistors PT2, PT3, NT2-NT5 may be coupled in series between the first power source voltage VCC terminal and the other end of the transistor NT1. The transistors PT2, NT4 may be turn on/off in response to a voltage of node which the transistor PT3, NT5 are coupled to. The transistors PT3, NT5 may be turn on/off in response to a voltage of node which the transistor PT2, NT4 are coupled to.

Figure 5A:
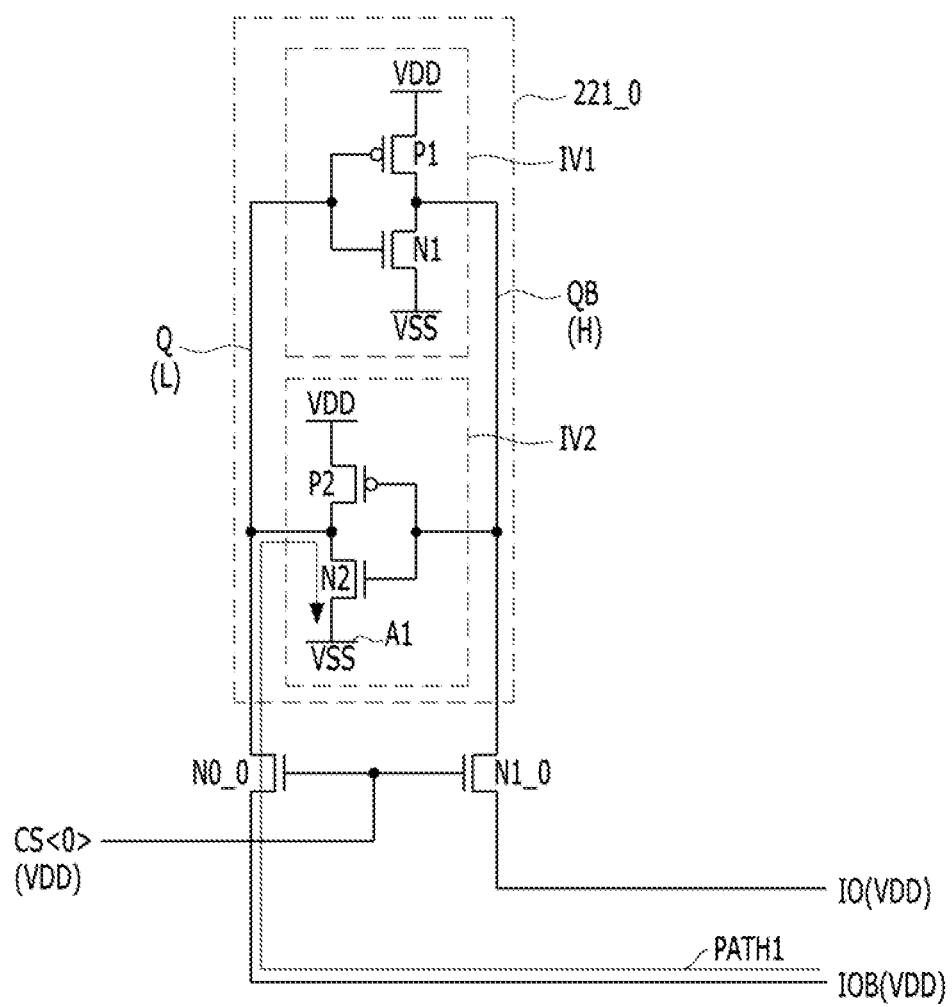
FIGS. 5A and 5B are circuit diagrams illustrating an operation of discharging charges from a pair of an input/output line IO and an input/output bar line IOB to a cache latch 221_0 in a non-volatile memory device.
Figure 5B:
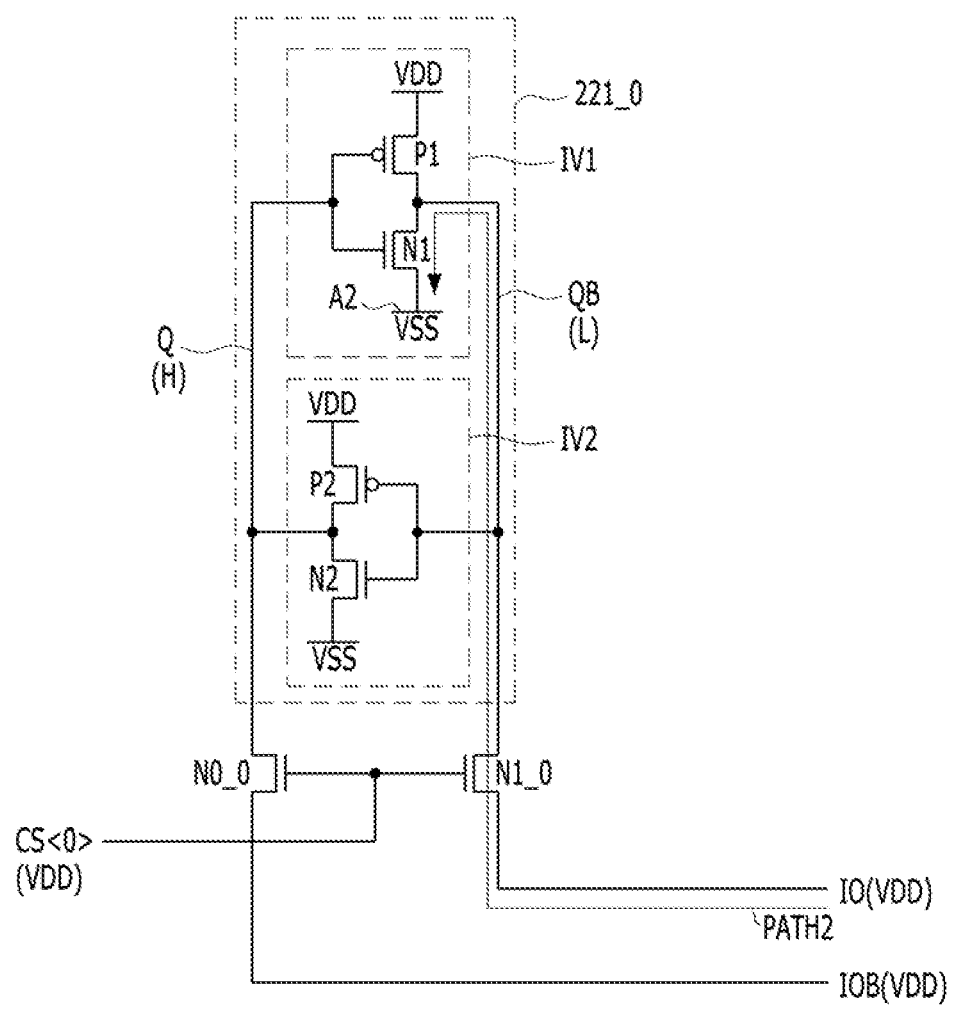

FIGS. 5A and 5B are circuit diagrams illustrating an operation of discharging charges from a pair of an input/output line IO and an input/output bar line IOB to the cache latch 221_0 in the non-volatile memory device. It is assumed that the cache latch 221_0 is selected and an operation of discharging charges from the pair of the input/output line IO and the input/output bar line IOB to the cache latch 221_0 is described hereafter.

Referring to FIG. 5A, when a first data (which is a low data, for example) is stored in the cache latch 221_0, a discharge path PATH1 may be formed from the input/output bar line IOB to the second inverter IV2. When the first data is stored in the cache latch 221_0, the voltage level of the data node Q may be a low logic level L, while the voltage level of the data bar node QB may be a high logic level H.

Since the voltage level of the data bar node QB is a high logic level, a second NMOS transistor N2 of the second inverter IV2 may be turned on. Therefore, charges may be discharged from the input/output bar line IOB to a ground voltage terminal A1 through the second NMOS transistor N2 following the discharge path PATH1.

Referring to FIG. 5B, when a second data (which is a high data, for example) is stored in the cache latch 221_0, a charge path PATH2 may be formed from the input/output line IO to the first inverter IV1. When the second data is stored in the cache latch 221_0, the voltage level of the data node Q may be a high logic level H, while the voltage level of the data bar node QB may be a low logic level L.

Since the voltage level of the data node Q is a high logic level, a first NMOS transistor N1 of the first inverter IV1 may be turned on. Therefore, charges may be discharged from the input/output bar line IOB to a ground voltage terminal A2 through the first NMOS transistor N1.

Figure 6A:
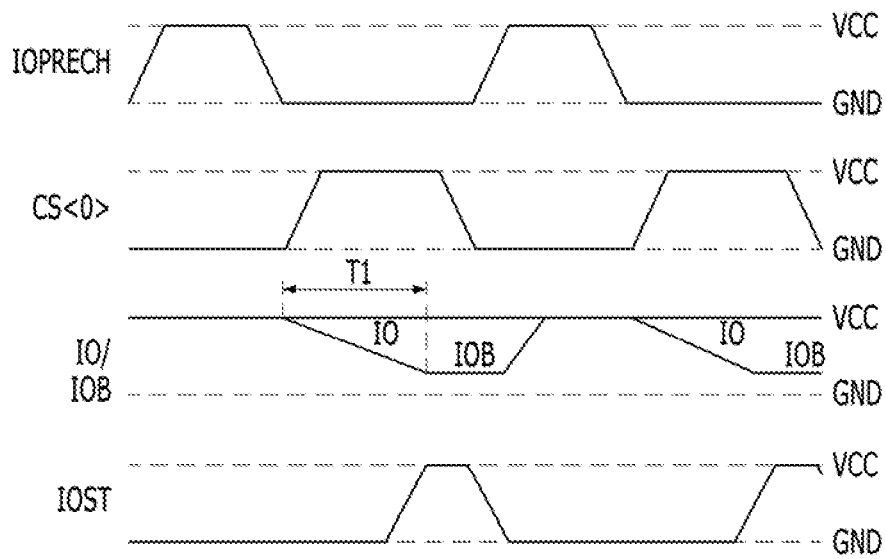
FIGS. 6A and 6B are timing diagrams for comparing an operation of the non-volatile memory device shown in FIG. 2 with an operation of a typical non-volatile memory device.
Figure 6B:
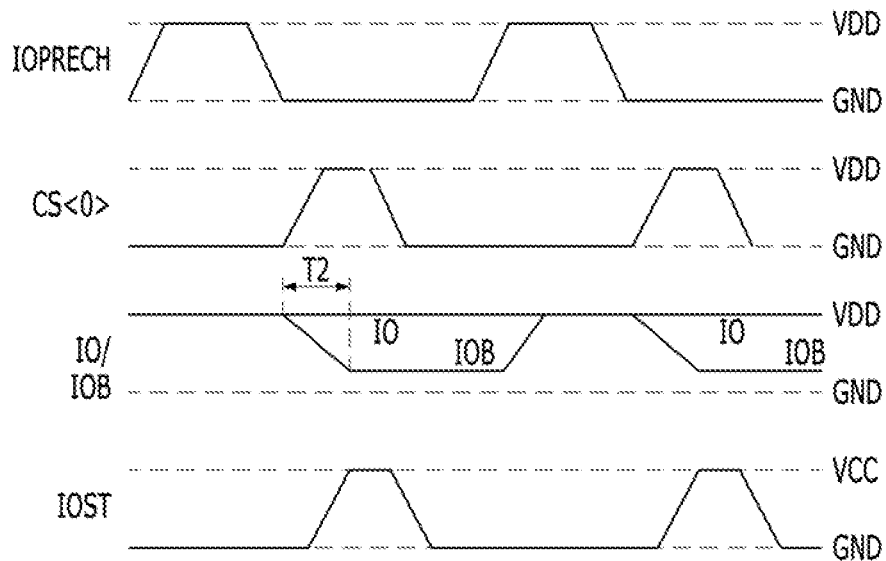

FIGS. 6A and 6B are timing diagrams for comparing an operation of the non-volatile memory device shown in FIG. 2 with an operation of a typical non-volatile memory device.

FIG. 6A is a timing diagram illustrating an operation of a typical non-volatile memory device.

When the pre-charge signal IOPRECH is enabled in the typical non-volatile memory device, the pair of the input/output line IO and the input/output bar line IOB may be pre-charged with the voltage level of the first power source voltage VCC. When the column selection signal CS<0> is enabled, a discharge path is formed between the pair of the input/output line IO and the input/output bar line IOB and the cache latch 221_0, and the voltage level of one input/output line between the input/output line IO and the input/output bar line IOB of the pair may drop. When the enable signal IOST is enabled after a predetermined time T1 passes from a moment when the column selection signal CS<0> is enabled, the sense amplifier 250 may amplify and output the data of the input/output line IO and the input/output bar line IOB of the pair.

FIG. 6B is a timing diagram illustrating an operation of the non-volatile memory device shown in FIG. 2.

In the non-volatile memory device of FIG. 2, when the pre-charge signal IOPRECH is enabled, the pair of the input/output line IO and the input/output bar line IOB may be pre-charged to the voltage level of the second power source voltage VDD. When the column selection signal CS<0> is enabled, a discharge path may be formed between the pair of the input/output line IO and the input/output bar line IOB and the cache latch 221_0, and the voltage level of one input/output line between the input/output line IO and the input/output bar line IOB may drop. When the enable signal IOST is enabled after a predetermined time T2 passes from the moment when the column selection signal CS<0> is enabled, the sense amplifier 250 may amplify and output the data of the input/output line IO and the input/output bar line IOB of the pair.

Figure 7:
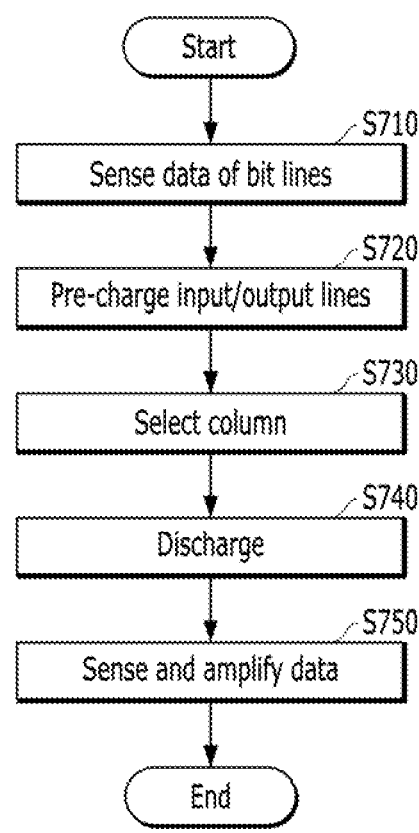
FIG. 7 is a flowchart describing a method for operating a non-volatile memory device, in accordance with an embodiment of the present invention.

The non-volatile memory device of FIG. 2 may reduce the time taken for making the voltage level difference between the input/output line IO and the input/output bar line IOB of the pair greater than a predetermined value by pre-charging the pair of the input/output line IO and the input/output bar line IOB with the second power source voltage VDD which is higher than the first power source voltage VCC, and applying the transistors on the discharge path through which the charges are discharged from the pair of the input/output line IO and the input/output bar line IOB to the selected cache latch 221_0 with the second power source voltage VDD to turn them on. In short, the predetermined time T1 is longer than the predetermined time T2 (T1>T2). Therefore, it is possible to make a non-volatile memory device operate at a high data rate by increasing a read operation rate of the non-volatile memory device. FIG. 7 is a flowchart describing a method for operating a non-volatile memory device, in accordance with an embodiment of the present invention. Referring to FIG. 7, the method may include a data sensing step S710, a pre-charging process step S720, a column selection process step S730, a discharge process step S740, and a data sensing process step S750.

In step S710, the page buffers 220_0 to 220_y may sense data of corresponding bit lines and store the sensed data in the cache latches 221_0 to 221_y.

In step S720, the pre-charger 240 may pre-charge a pair of an input/output line IO and an input/output bar line IOB with a second power source voltage VDD having a higher voltage level than the voltage level of the first power source voltage VCC.

In step S730, a column selection signal corresponding to a selected column, e.g., column selection signal CS<0>, is enabled to the voltage level of the second power source voltage VDD to turn on the corresponding switch, e.g., a switch 230_0. When the switch 230_0 is turned on, a cache latch 221_0 and the pair of the input/output line IO and the input/output bar line IOB may be coupled to each other.

In step S740, current may flow (in other words, charges are discharged) from the pair of the input/output line IO and the input/output bar line IOB to the cache latch 221_0 so as to increase the voltage level difference between the input/output line IO and the input/output bar line IOB. Herein, if the data stored in the cache latch 221_0 is a low data, a discharge path PATH1 is formed from the input/output bar line IOB between the input/output line IO and the input/output bar line IOB to a second NMOS transistor N2 of a second inverter IV2 and the current flows through the discharge path PATH1. If the data stored in the cache latch 221_0 is a high data, a discharge path PATH2 is formed from the input/output line IO between the input/output line IO and the input/output bar line IOB to a first NMOS transistor N1 of a first inverter IV1 and the current flows through the discharge path PATH2.

In step S750, a sense amplifier 250 may sense and amplify the data of the pair of the input/output line IO and the input/output bar line IOB by using the first power source voltage VCC, and output the amplified data DAT and DATB. Herein, when the voltage level of the input/output line IO is higher than the input/output bar line IOB, the output data DAT comes to be of a high logic level, while the output data DATB comes to be of a low logic level (which means that a high data is outputted). When the voltage level of the input/output bar line IOB is higher than the input/output line IO, the output data DAT comes to be of a low logic level, while the output data DATB comes to be of a high logic level (which means that a low data is outputted).

According to the method for operating a non-volatile memory device of FIG. 7, it is possible to reduce the time taken for making the voltage level difference between the input/output line IO and the input/output bar line IOB greater than a predetermined value. Therefore, it is possible to increase a read operation rate of the non-volatile memory device and thereby make the non-volatile memory device operate at a higher data rate.

According to the embodiments of the present invention, the read operation rate of a non-volatile memory device may be increased by raising the operation voltage of a structure for sensing data and pre-charge level of input/output lines.

While the present invention has been described with respect to the specific embodiments, it will be apparent to those skilled in the art that various changes and modifications may be made without departing from the spirit and scope of the invention as defined in the following claims.

What is claimed is:

1. A non-volatile memory device, comprising:
   a plurality of cache latches;
   a pair of input/output lines;
   a plurality of switches, each couples a corresponding cache latch to the pair of the input/output lines, when the corresponding cache latch is selected among the plurality of cache latches;
   a pre-charger suitable for pre-charging the pair of the input/output lines; and
   a sense-amplifier suitable for sensing and amplifying the data of the pair of the input/output lines,
   wherein the sense-amplifier operates with a first power source voltage, and all of the plurality of the cache latches, the plurality of the switches and the pre-charger operate with a second power source voltage having a voltage level that is higher than the voltage level of the first power source voltage,
   wherein a time taken for making a voltage level difference between the pair of input/output lines greater than a predetermined value is reduced by pre-charging the pair of input/output lines with the second power source voltage and applying transistors on a discharge path through which the charges are discharged from the pair of the input/output lines to the selected cache latch with the second power source voltage to turn the transistors on.

2. The non-volatile memory device of claim 1, wherein each of the plurality of the cache latches includes:
   a data node;
   a data bar node;
   a first inverter that operates with the second power source voltage and drives the data bar node in response to a voltage of the data node; and
   a second inverter that operates with the second power source voltage and drives the data node in response to a voltage of the data bar node.

3. The non-volatile memory device of claim 2, wherein the first inverter includes:
- a first PMOS transistor that has a first end coupled to the data bar node and a second end supplied with the second power source voltage, and is turned on/off in response to a voltage of the data node; and
- a first NMOS transistor that has a first end coupled to the data bar node and a second end supplied with a ground voltage, and is turned on/off in response to the voltage of the data node, and the second inverter includes:
- a second PMOS transistor that has a first end coupled to the data node and a second end supplied with the second power source voltage, and is turned on/off in response to a voltage of the data bar node; and
- a second NMOS transistor that has a first end coupled to the data node and a second end supplied with the ground voltage, and is turned on/off in response to the voltage of the data bar node.

4. The non-volatile memory device of claim 1, wherein the pair of the input/output lines includes an input/output line and an input/output bar line, and
each of the plurality of the switches includes:
- a first switch transistor that is coupled between a data node and the input/output bar line and turned on/off in response to a corresponding column selection signal among a plurality of column selection signals whose enabling level is a voltage level of the second power source voltage; and
- a second switch transistor that is coupled between a data bar node and the input/output line and turned on/off in response to the corresponding column selection signal among the plurality of the column selection signals.

5. The non-volatile memory device of claim 1, wherein the pair of the input/output lines includes an input/output line and an input/output bar line, and
the pre-charger includes:
- a first pre-charge transistor that has a first end coupled to the input/output line and a second end supplied with the second power source voltage, and is turned on during a pre-charge time period; and
- a second pre-charge transistor that has a first end coupled to the input/output bar line and a second end supplied with the second power source voltage, and is turned on during the pre-charge time period.

6. The non-volatile memory device of claim 1, wherein the pre-charger pre-charges the pair of the input/output lines with the second power source voltage during a pre-charge time period.

7. A non-volatile memory device, comprising:
- a plurality of cell strings each of which includes one or more non-volatile memory cells serially coupled to each other;
- a plurality of bit lines that are coupled to corresponding cell strings, respectively, among the plurality of the cell strings;
- a plurality of page buffers each of which includes a cache latch, senses a data of a corresponding bit line among the plurality of the bit lines during a read operation, and stores the sensed data in the cache latch;
- a pair of input/output lines;
- a plurality of switches each of which couples a corresponding cache latch to the pair of the input/output lines when the corresponding cache latch is selected among a plurality of cache latches;
- a pre-charger that pre-charges the pair of the input/output lines; and
- a sense-amplifier that amplifies data of the pair of the input/output lines and outputs amplified data, wherein the plurality of the page buffers and the sense-amplifier operate with a first power source voltage, and all of the cache latches, the plurality of the switches and the pre-charger operate with a second power source voltage whose voltage level is higher than a voltage level of the first power source voltage, wherein a time taken for making a voltage level difference between the pair of input/output lines greater than a predetermined value is reduced by pre-charging the pair of input/output lines with the second power source voltage and applying transistors on a discharge path through which the charges are discharged from the pair of the input/output lines to the selected cache latch with the second power source voltage to turn the transistors on.

8. The non-volatile memory device of claim 7, wherein each of the plurality of the cache latches includes:
- a data node;
- a data bar node;
- a first inverter that operates with the second power source voltage and drives the data bar node in response to a voltage of the data node; and
- a second inverter that operates with the second power source voltage and drives the data node in response to a voltage of the data bar node.

9. The non-volatile memory device of claim 8, wherein the pair of the input/output lines includes an input/output line and an input/output bar line, and
the pre-charger includes:
- a first pre-charge transistor that has a first end coupled to the input/output line and a second end supplied with the second power source voltage, and is turned on during a pre-charge time period; and
- a second pre-charge transistor that has a first end coupled to the input/output bar line and a second end supplied with the second power source voltage, and is turned on during the pre-charge time period.

10. The non-volatile memory device of claim 9, wherein the first inverter includes:
- a first PMOS transistor that has a first end coupled to the data bar node and a second end supplied with the second power source voltage, and is turned on/off in response to a voltage of the data node; and
- a first NMOS transistor that has a first end coupled to the data bar node and a second end supplied with a ground voltage, and is turned on/off in response to the voltage of the data node, and the second inverter includes:
- a second PMOS transistor that has a first end coupled to the data node and a second end supplied with the second power source voltage, and is turned on/off in response to a voltage of the data bar node; and
- a second NMOS transistor that has a first end coupled to the data node and a second end supplied with the ground voltage, and is turned on/off in response to the voltage of the data bar node.

11. The non-volatile memory device of claim 10, wherein when the data stored in the cache latch during a read operation is a first data, a first discharge path is formed from the input/output bar line to the second end of the second NMOS transistor, and when the data stored in the cache latch during the read operation is a second data, a second discharge path is formed from the input/output line to the second end of the first NMOS transistor.

12. The non-volatile memory device of claim 7, wherein the pair of the input/output lines includes
an input/output line and an input/output bar line, and
each of the plurality of the switches includes:
   a first switch transistor that is coupled between a data node and the input/output bar line and turned on/off in response to a corresponding column selection signal among a plurality of column selection signals whose enabling level is a voltage level of the second power source voltage; and
   a second switch transistor that is coupled between a data bar node and the input/output line and turned on/off in response to the corresponding column selection signal among the plurality of the column selection signals.

13. The non-volatile memory device of claim 7, wherein the pre-charger pre-charges the pair of the input/output lines with the second power source voltage during a pre-charge time period.

14. A method for operating a non-volatile memory device that comprises a plurality of cache latches and a plurality of switches coupling corresponding cache latches among the plurality of the cache latches to a pair of input/output lines, and operates with a first power source voltage, comprising:
   pre-charging the pair of the input/output lines with a second power source voltage whose voltage level is higher than the first power source voltage;
   turning on a switch among the plurality of the switches that corresponds to a selected cache latch among the plurality of the cache latches by supplying the second power source voltage to the switch; and
   letting current flow from the pair of the input/output lines to the selected cache latch,
   wherein all of the plurality of the cache latches and the plurality of the switches operate with the second power source voltage,
   wherein a time taken for making a voltage level difference between the pair of input/output lines greater than a predetermined value by pre-charging the pair of input/output lines with the second power source voltage and applying transistors on a discharge path through which the charges are discharged from the pair of the input/output lines to the selected cache latch with the second power source voltage to turn the transistors on.

15. The method of claim 14, further comprising:
   amplifying data of the pair of the input/output lines by using the first power source voltage and outputting amplified data.

16. The method of claim 14, wherein the non-volatile memory device further comprises:
   a plurality of bit lines corresponding to the plurality of the cache latches, respectively, and
   the method further comprising:
   storing data of the plurality of the bit lines in the plurality of the cache latches.

17. The method of claim 14, wherein each of the plurality of the cache latches includes
   a data node;
   a data bar node;
   a first inverter that operates with the second power source voltage and drives the data bar node in response to a voltage of the data node; and
   a second inverter that operates with the second power source voltage and drives the data node in response to a voltage of the data bar node.

18. The method of claim 17, wherein in the letting the current flow from the pair of the input/output lines to the selected cache latch,
   when the data stored in the cache latch is a first data, a first discharge path is formed from the pair of the input/output lines to the second inverter, and
   when the data stored in the cache latch is a second data, a second discharge path is formed from the pair of the input/output lines to the first inverter.

* * * * *